United States Patent
Yamato

(10) Patent No.: US 7,149,494 B2
(45) Date of Patent: Dec. 12, 2006

(54) DEMULTIPLEXER AND COMMUNICATION DEVICE

(75) Inventor: Shuji Yamato, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 298 days.

(21) Appl. No.: 10/917,478

(22) Filed: Aug. 13, 2004

(65) Prior Publication Data

US 2005/0070332 A1    Mar. 31, 2005

(30) Foreign Application Priority Data

Sep. 25, 2003  (JP) .............. 2003-332928
Jul. 7, 2004   (JP) .............. 2004-201119

(51) Int. Cl.
H04B 1/26  (2006.01)
H04B 1/28  (2006.01)
H04B 1/18  (2006.01)

(52) U.S. Cl. .............. 455/327; 455/333; 455/193.1

(58) Field of Classification Search ............. 455/562.1, 455/78, 83, 193.1, 560, 327, 333, 334, 120, 455/121; 333/187–196, 133, 126, 128, 129, 333/185
See application file for complete search history.

(56) References Cited

U.S. PATENT DOCUMENTS

| | | | |
|---|---|---|---|
| 5,561,406 A * | 10/1996 | Ikata et al. | 333/126 |
| 5,859,473 A | 1/1999 | Ikata et al. | |
| 6,469,593 B1 * | 10/2002 | Nishizawa et al. | 333/133 |
| 6,501,344 B1 * | 12/2002 | Ikata et al. | 333/133 |
| 6,556,100 B1 * | 4/2003 | Takamine | 333/133 |
| 6,781,479 B1 * | 8/2004 | Ikada et al. | 333/133 |
| 6,784,759 B1 * | 8/2004 | Maekawa et al. | 333/132 |
| 6,906,600 B1 * | 6/2005 | Nagai | 333/133 |
| 2003/0025572 A1 | 2/2003 | Maekawa et al. | |
| 2003/0132817 A1 | 7/2003 | Nagai | |
| 2005/0046512 A1 * | 3/2005 | Kihara et al. | 333/133 |
| 2005/0174192 A1 * | 8/2005 | Kawamura | 333/133 |
| 2006/0066419 A1 * | 3/2006 | Iwaki et al. | 333/133 |
| 2006/0181366 A1 * | 8/2006 | Taniguchi | 333/133 |

FOREIGN PATENT DOCUMENTS

| | | |
|---|---|---|
| EP | 1 137 177 A2 | 9/2001 |
| JP | 10-093382 | 4/1998 |
| JP | 10-270976 | 10/1998 |
| JP | 2001-053577 | 2/2001 |
| JP | 2001-339273 | 12/2001 |
| JP | 2003-101384 A | 4/2003 |
| JP | 2003-332885 | 11/2003 |

OTHER PUBLICATIONS

Offical communication issued in the corresponding Korean Patent Application No. 10-2004-0076958, mailed on Jun. 28, 2006.

* cited by examiner

*Primary Examiner*—Sonny Trinh
(74) *Attorney, Agent, or Firm*—Keating & Bennett, LLP

(57) ABSTRACT

A demultiplexer includes an antenna terminal, a reception filter connected to the antenna terminal, a transmission filter connected in parallel to the reception filter with respect to the antenna terminal and having a pass band center frequency that is different from the reception filter, a common inductance component connected between the ground terminal of the transmission filter and the ground terminal of the reception filter, and inductance components, which are different from the common inductance component, provided between the common inductance component and the reception filter and between the common inductance component and the transmission filter.

20 Claims, 15 Drawing Sheets

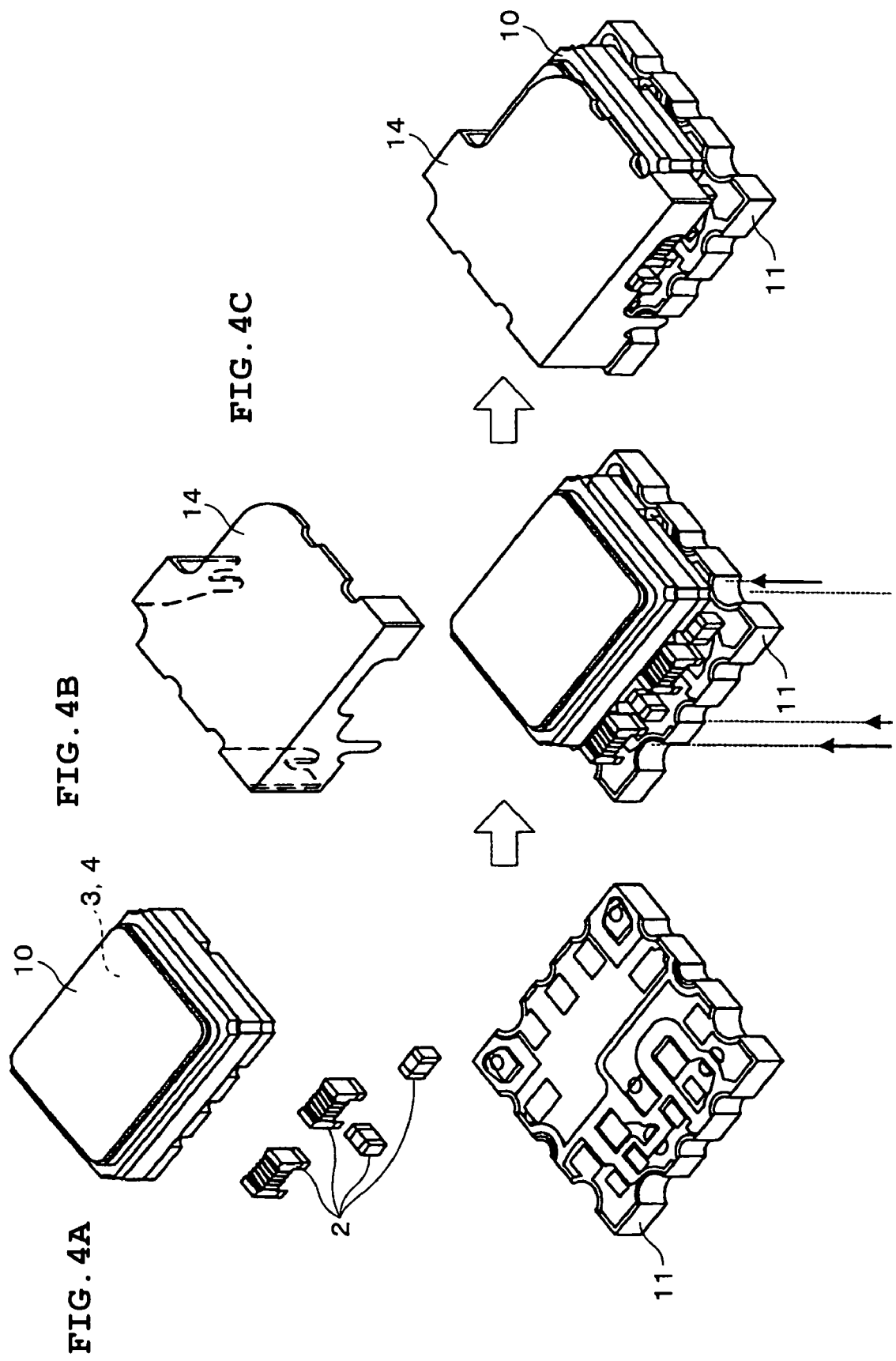

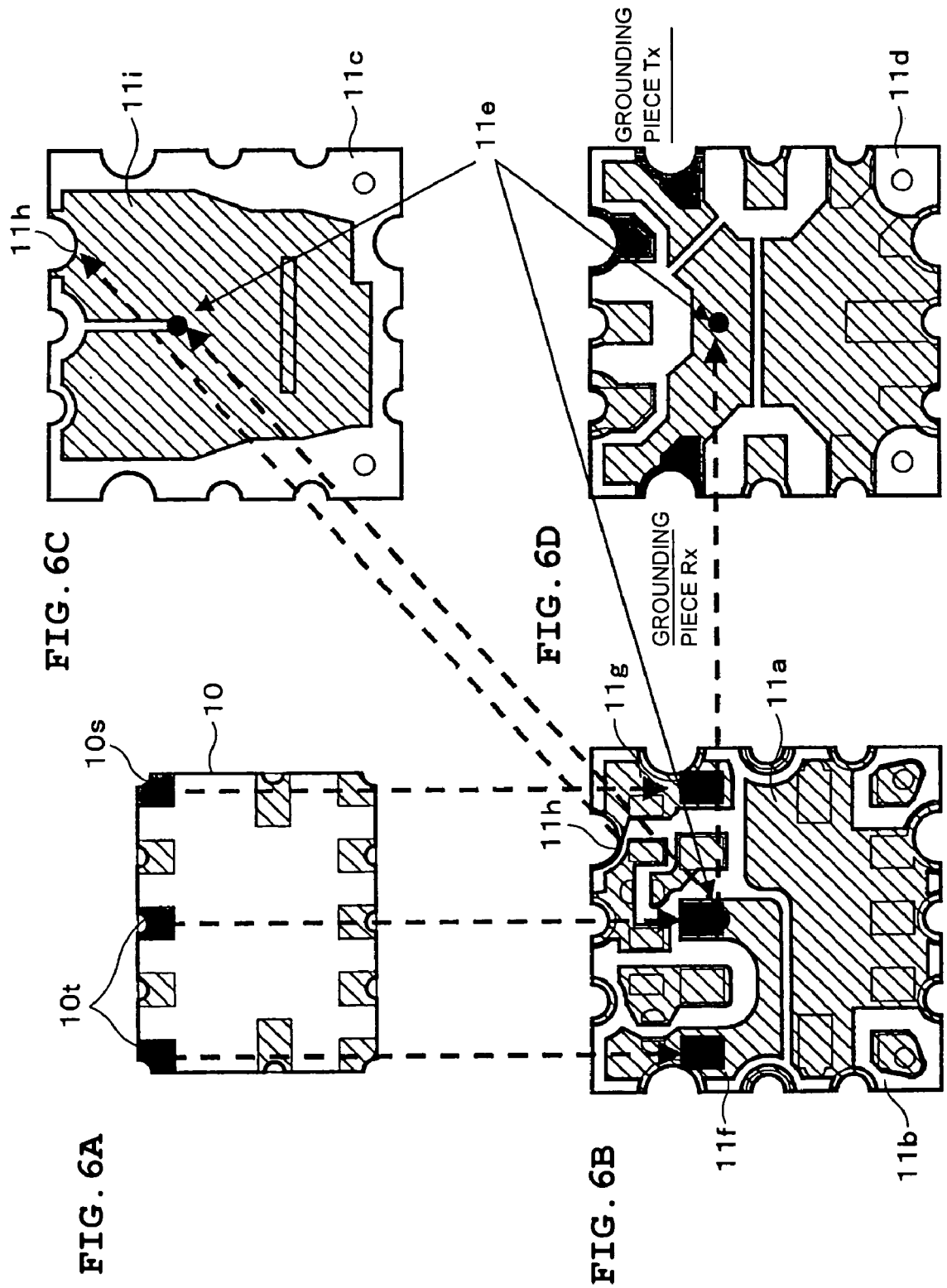

DEMULTIPLEXER AND COMMUNICATION DEVICE

BACKGROUND OF THE INVENTION

1. Field of the Invention

The present invention relates to a demultiplexer connected to an antenna for use in communication equipment, the demultiplexer having greatly improved characteristics and greatly reduced size, and further, the present invention relates to a communication device including such a demultiplexer.

2. Description of the Related Art

In recent years, many filters have been used in a small-sized communication device such as a portable telephone or the like. An example of the above-mentioned filters is a demultiplexer as shown in FIG. 13. The demultiplexer is provided with a transmission filter and a reception filter to isolate a signal in a transmission band (824 MHz to 849 MHz) and a signal in a reception band (869 MHz to 894 MHz) from each other. The reception band is set to be higher than the transmission band.

It has been more urgently needed to reduce the sizes, the heights, and the weights of small-sized communication devices. Also, such requirements have also been demanded of the above-described demultiplexers. Moreover, in the small-sized communication devices, higher communication frequencies have been used with increases in the volume of communication information and data, such as image data, streaming video data or the like.

Thus, surface acoustic wave filters having surface acoustic wave resonators combined with each other into a ladder configuration and piezoelectric filters having piezoelectric thin-film resonators combined with each other into a ladder configuration have been used for the above-described demultiplexers. These filters can be reduced in size, height, and weight, which has been required with increasing of the communication frequencies.

As shown in FIG. 15, such a known demultiplexer as described above includes a phase-matching circuit 52 connected to an antenna terminal 51, a transmission filter 53 and a reception filter 54 each connected to the phase matching circuit 52, a transmission terminal (Tx) 55 connected to the transmission filter 53, and a reception terminal (Rx) 56 connected to the reception filter 54.

Referring to the demultiplexer, according to Japanese Unexamined Patent Application Publication No. 10-270976 (Patent Document 1), to improve the isolation characteristic caused in the direction extending from the transmission side to the reception side, the grounding elements for the parallel arm resonators 53a of the transmission filter 53 are intentionally separated. As a result, the resonators 53a are grounded via plural ground positions 53b. The grounding elements for the parallel arm resonator 54a of the reception filter 54 are intentionally separated. Thus, the resonators 54a are grounded via plural ground positions 54b. Thus, the isolation characteristic is improved.

Referring to FIG. 15, inductance components are caused between the ground terminal of the parallel arm resonators 53a and the ground positions 53b and also between the ground terminal of the parallel arm resonators 54a and the ground positions 54b, due to wires or through holes which function as connection lines.

Moreover, according to Japanese Unexamined Patent Application Publication No. 2001-53577 (Patent Document 2), to improve out-of-band attenuation in a higher frequency band compared to a pass band, grounding elements for the parallel arm resonators of a transmission filter are electrically connected to each other via a common element, and then, the parallel arm resonators are grounded. Grounding elements for the parallel arm resonator of a reception filter are electrically connected to each other via a common element. Then, the parallel arm resonators are grounded. Moreover, the grounding elements for the parallel arm resonators of the transmission filter and the grounding elements for the parallel arm resonators of the reception filter are electrically connected to each other via a common element. Thus, the out-of-band attenuation is improved.

However, according to the known technique described in Patent Document 1, the ground electrode area for constituting the ground positions has a limitation on the realization of a satisfactory isolation characteristic, since the market requires the reduction in size of demultiplexers.

In particular, according to the known technique described in Patent Document 1, the number of ground terminals for grounding filter-chips must be larger than that of the parallel arm piezoelectric elements combined in the ladder configuration. Accordingly, the number of the ground terminals, and the number of ground electrode patterns extending from the ground terminals to the filter chips are increased. Thus, the size of the package becomes large, and the lamination-number of the multi-layer structure is increased. Thus, problems occur in that the height and the size of the demultiplexer are increased.

Moreover, according to the known technique described in Patent Document 2, the grounding element for the parallel arm resonators of the transmission filter and that for the parallel arm resonator of the reception filter are electrically connected to each other via a common element. Problematically, this deteriorates the isolation characteristic.

As seen in the above-description, according to the known demultiplexers, it has been difficult to realize both of the sufficient isolation characteristic and the reduction in size.

SUMMARY OF THE INVENTION

According to preferred embodiments of the present invention, a demultiplexer includes an antenna terminal, a reception filter connected to the antenna terminal, a transmission filter connected in parallel to the reception filter with respect to the antenna terminal and having a pass band center frequency that is different from the reception filter, a common inductance component connected between the ground terminal of the transmission filter and the ground terminal of the reception filter, and inductance components, which are different from the common inductance component, provided between the common inductance component and the reception filter and between the common inductance component and the transmission filter, the inductance components being different from the common inductance component.

Preferably, in the demultiplexer, at least one of the reception filter and the transmission filter is a surface acoustic wave filter.

Preferably, in the demultiplexer, at least one of the reception filter and the transmission filter is a piezoelectric filter.

Preferably, in the demultiplexer, a metallic cover, a strip line disposed in a printed circuit board, or a strip line disposed in a package serves also as the common inductance component. According to the above-described constitution, the size of the demultiplexer is not increased, since the common inductance component is provided and arranged as described above. Preferably, the common inductance component has an inductance of not more than about 0.1 nH.

According to the above-described constitution of preferred embodiments of the present invention, in the demultiplexer, the ground terminals of the transmission filter and the reception filter are electrically connected to each other via the common inductance component, e.g., having an inductance of not more than about 0.1 nH. Moreover, the inductance components, which are different from the common inductance component, are provided between the common inductance component and the reception filter and between the common inductance component and the transmission filter. Thus, the isolation characteristic and the pass-characteristic between the transmission filter and the reception filter can be assured. Moreover, the steepness and the attenuation in the vicinity of the low frequency range side of the reception filter and also, the steepness and the attenuation in the vicinity of the low frequency range side of the isolation characteristic can be improved without the in-band loss being influenced. The area and the number of terminals required for separation of grounding elements according to a known technique can be reduced, since a common ground pattern is used. Thus, the size of the demultiplexer can be decreased.

Other features, elements, characteristics and advantages of the present invention will become more apparent from the following detailed description of preferred embodiments of the present invention with reference to the attached drawings.

BRIEF DESCRIPTION OF THE DRAWINGS

FIGS. 4A, 4B, and 4C are exploded perspective views showing the assembly process for an example of the demultiplexer having a module structure which is provided with a package, a printed circuit substrate, and a metallic cover;

FIGS. 6A to 6D are plan views showing the back surface of the package and the wiring patterns of the respective laminated board portions of the printed circuit;

DETAILED DESCRIPTION OF PREFERRED EMBODIMENTS

Hereinafter, preferred embodiments according to the present invention will be described with reference to FIG. 1 to FIG. 14.

Figure 13:
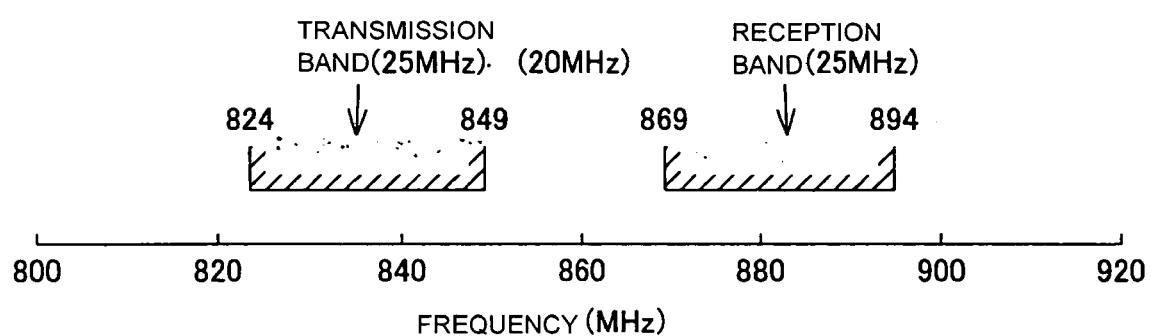
FIG. 13 is a graph showing the transmission band (824 MHz to 849 MHz) and the reception band (869 MHz to 894 MHz) of the frequency arrangement AMPS applied in the demultiplexer.
Figure 14:
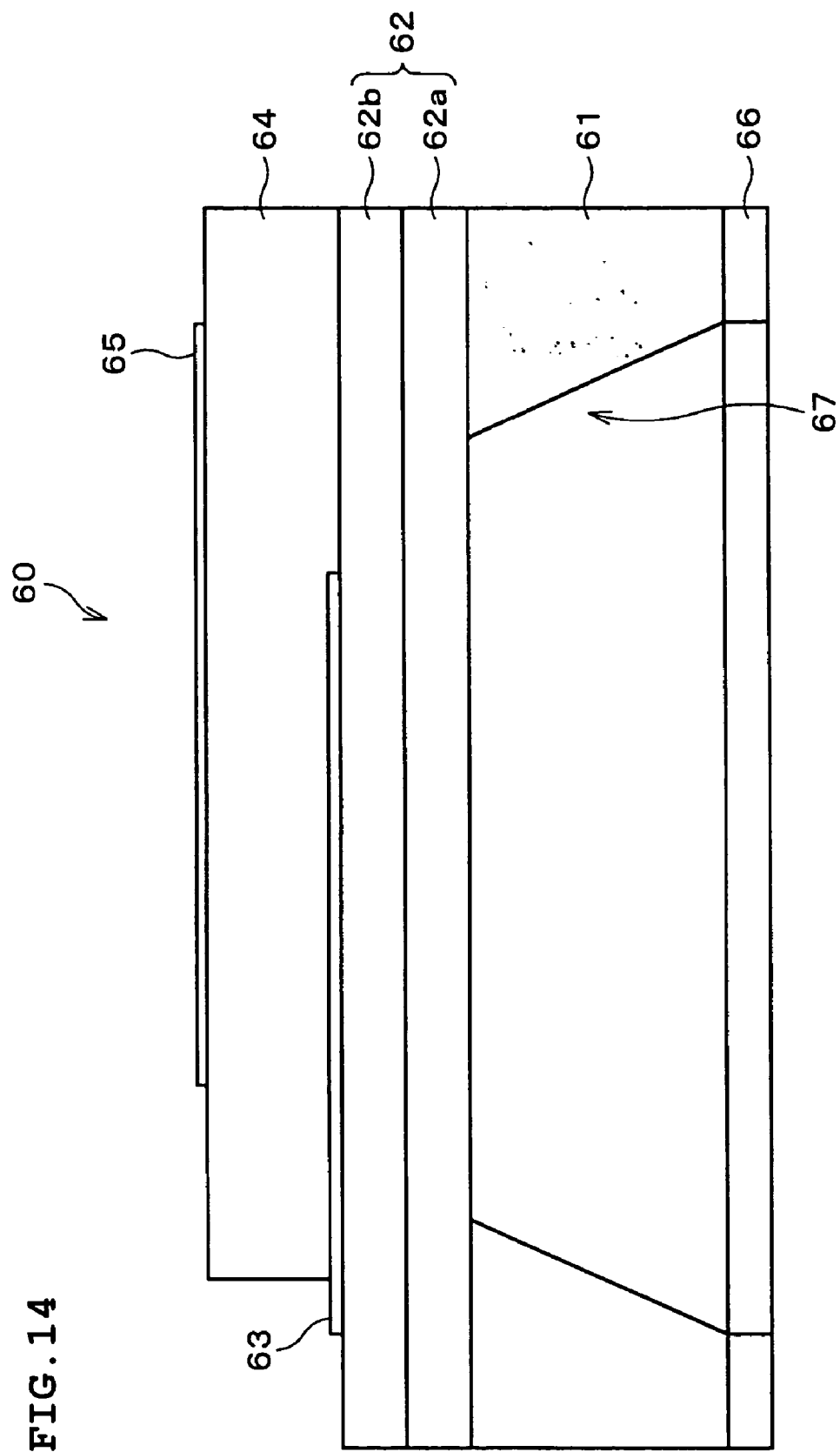
FIG. 14 is a cross-sectional view of a piezoelectric thin-film resonator for use in a demultiplexer according to another preferred embodiment of the present invention.
Figure 15:
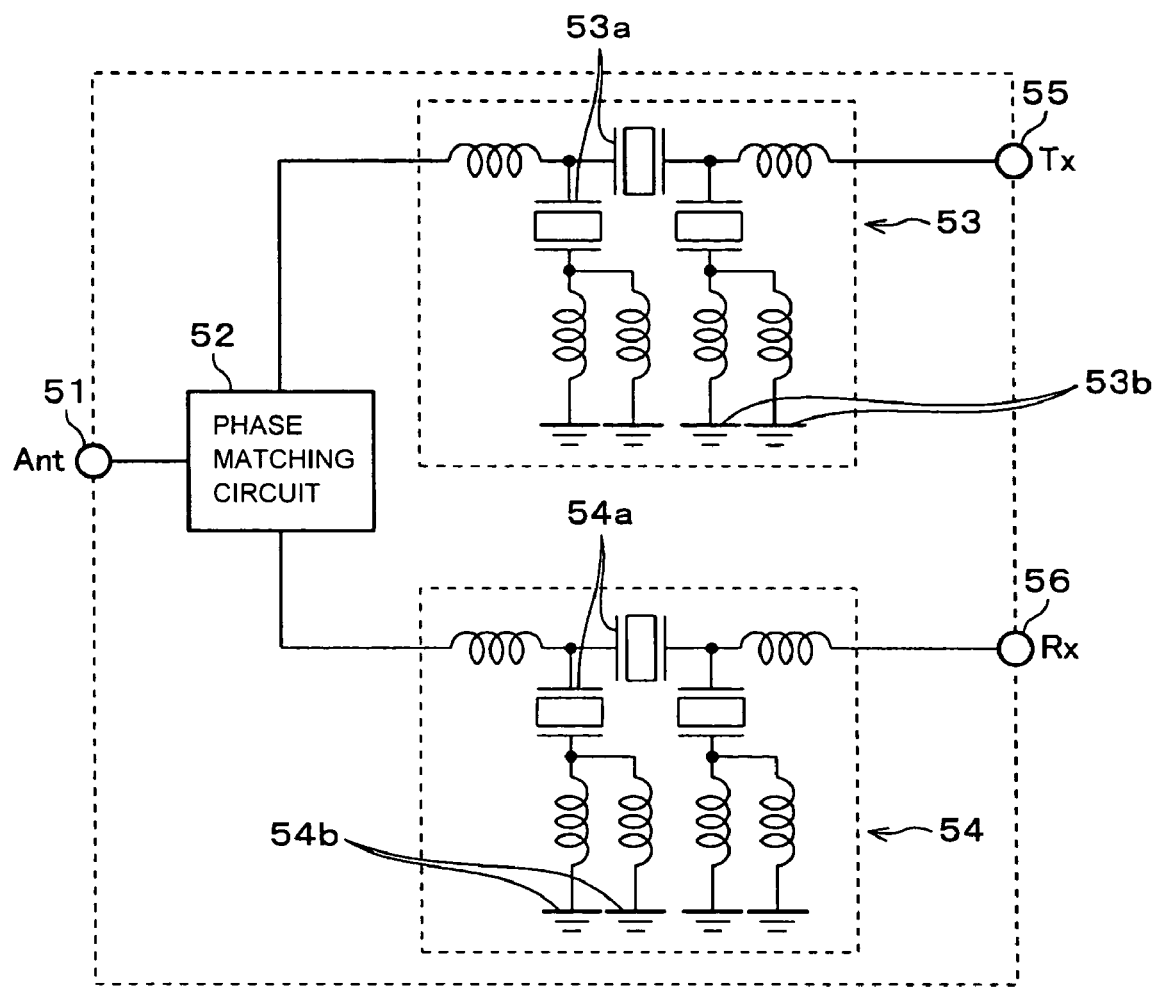
FIG. 15 is a block diagram of a known demultiplexer.

In this preferred embodiment, a demultiplexer having a frequency arrangement AMPS (Advanced MobilePhone Service) shown in FIG. 13 is described. In the frequency arrangement AMPS, the bandwidth of the high frequency band (824 MHz to 849 MHz) is preferably about 25 MHz, and that of the reception band (869 MHz to 894 MHz) is preferably about 25 MHz. Thus, the interval between the upper limit of the transmission band and the lower limit of the reception band is small, i.e., about 20 MHz (849 MHz to 869 MHz). Thus, regarding the frequency characteristic of each of the filters in the transmission band and the reception band, high steepness, i.e., a large attenuation ratio in the range extending from the pass band of the filter to the opposite band (i.e., the transmission band with respect to the reception band, and the reception band with respect to the transmission band) is required, and also, a large attenuation amount in the opposite band is necessary.

Figure 1:
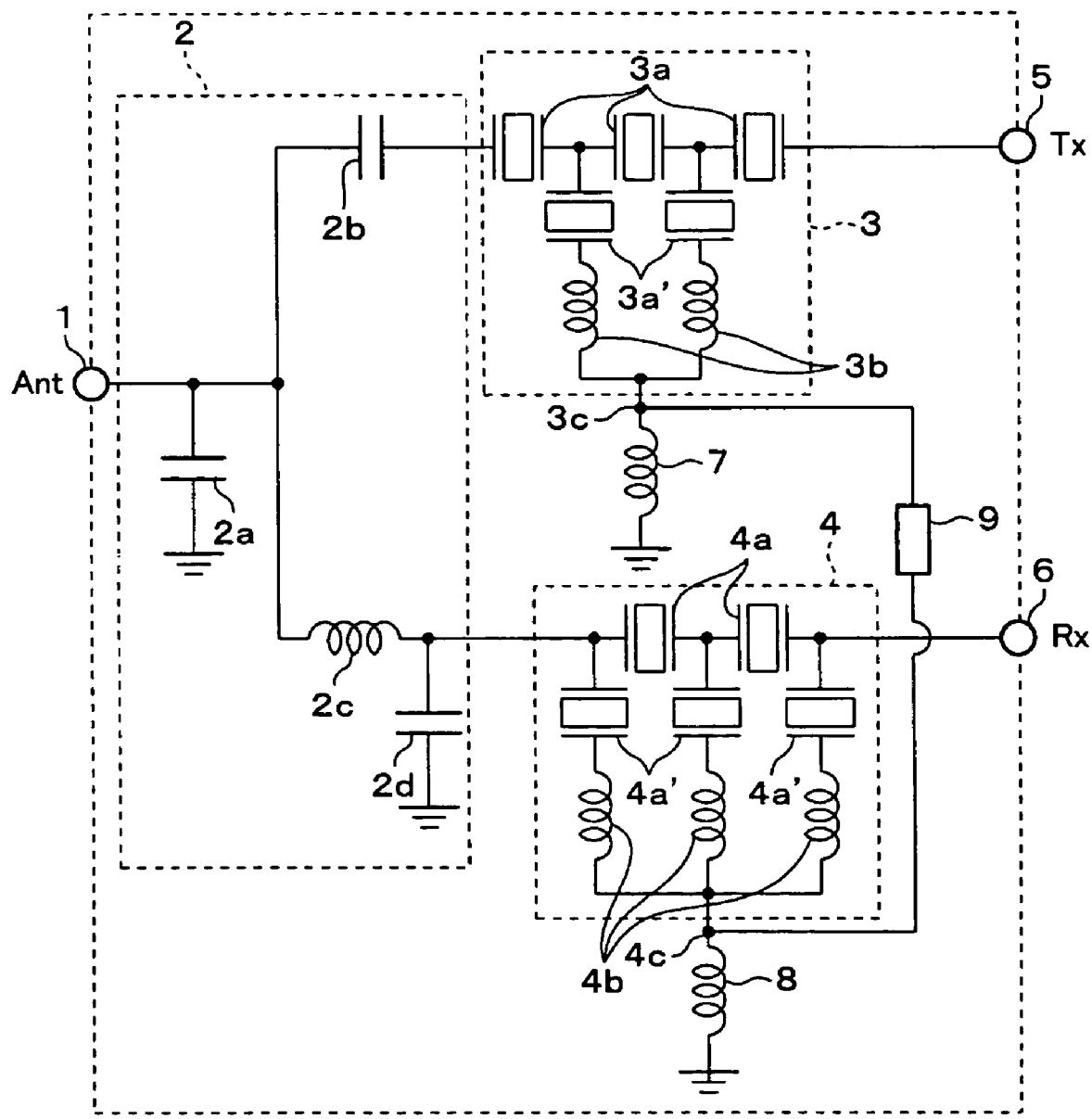
FIG. 1 is a schematic circuit diagram of a demultiplexer according to a preferred embodiment of the present invention.
Figure 2:
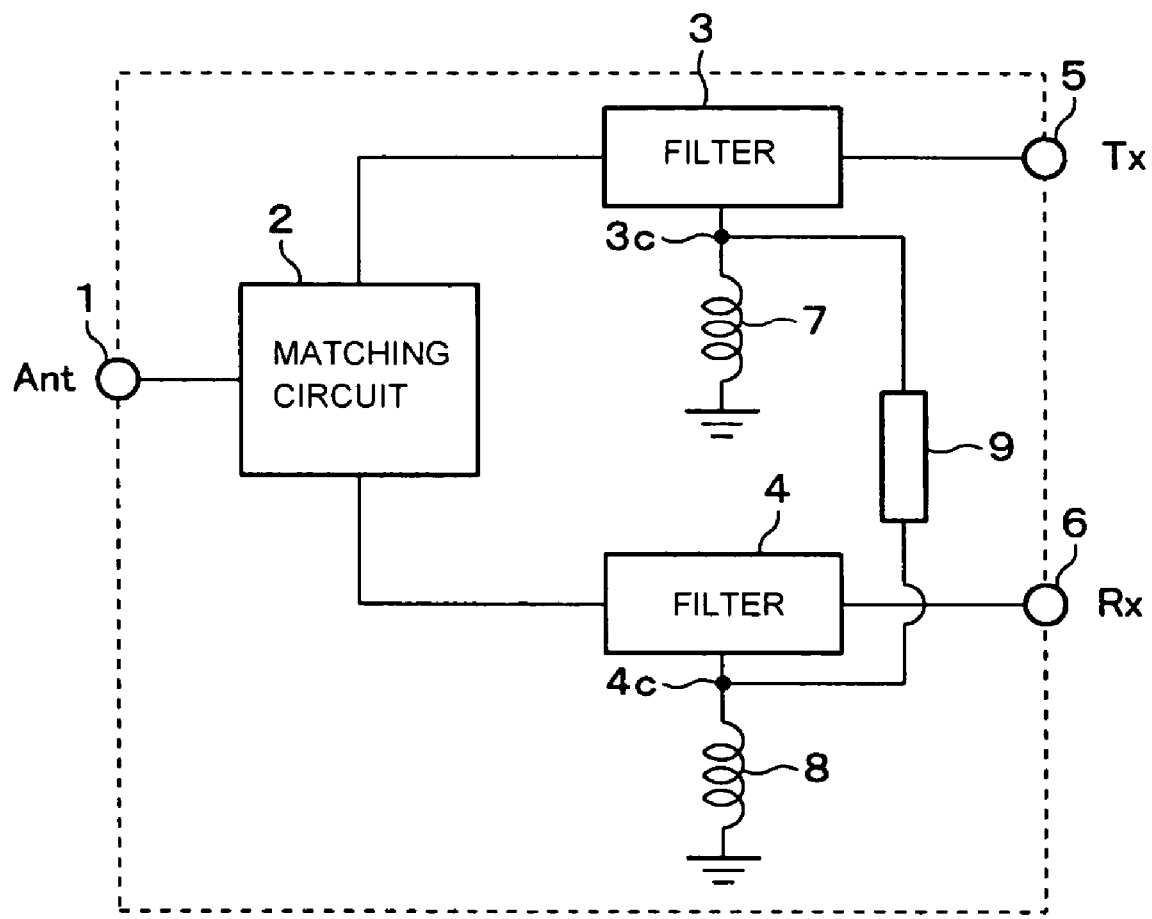
FIG. 2 is a circuit block diagram of the demultiplexer of FIG. 1.

FIG. 1 is a circuit diagram of a demultiplexer according to a first preferred embodiment of the present invention. FIG. 2 is a block diagram of the demultiplexer including surface acoustic wave filters (SAW filters) according to the first preferred embodiment of the present invention. The demultiplexer is provided with a transmission filter 3 and a reception filter 4. The transmission filter 3 is a ladder type SAW filter which includes three series (series arm) resonators 3a and two parallel (parallel arm) resonators 3a'. The transmission filter has the transmission band as a pass band. The reception filter 4 is a ladder type SAW filter which includes two series (series arm) resonators 4a and three parallel (parallel arm) resonators 4a'. The reception filter has the reception band as a pass band.

The configurations of the series resonators and the parallel resonators of the transmission filter 3 and the reception filter 4 which are ladder type SAW filters may differ from the above-described ones. Furthermore, the reception filter 4 and the transmission filter 3 may be contained in different packages or in one package.

In the above-described demultiplexer, an inductance component 7 is formed in the range extending from the ground terminal 3c of the transmission filter 3 to the connection to the ground out of the package. The inductance component 7 is generated due to the wiring such as a through-hole, a strip line and so forth provided in the package. Similarly, an inductance component 8 is formed in the range extending from the ground terminal 4c of the reception filter 4 to the connection to the ground out of the package. The inductance component 8 is generated due to a wiring such as a through-hole, a strip line and so forth provided in the package.

Moreover, the demultiplexer is provided with a matching circuit 2 which includes capacitance elements 2a, 2b, and 2d and an inductance element 2c on the antenna terminal 1 side. The configuration of the matching circuit 2 may differ from the above-described one.

Figure 3:
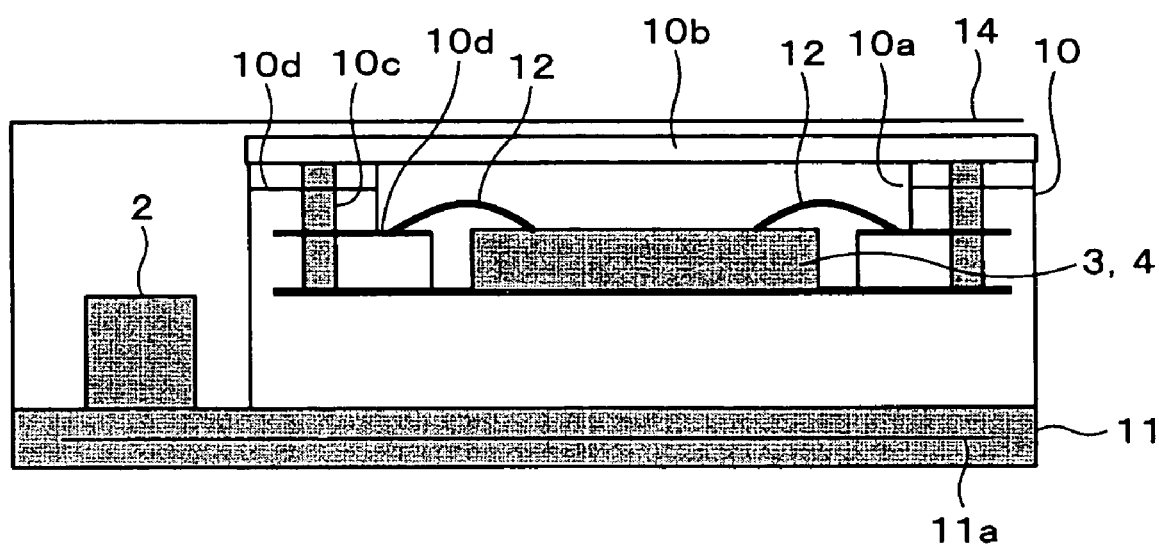
FIG. 3 is a cross-sectional view of the demultiplexer having a module structure which is provided with a package and a printed circuit board.

Moreover, as shown in FIG. 3, the reception filter 4 and the transmission filter 3 each including the SAW filters are contained in a chip type package 10 and have a multi-layer structure. The package 10 includes the reception filter 4 and the transmission filter 3 in an internal space 10a thereof. The reception filter 4 and the transmission filter 3 can be sealed with a lid 10b. In FIG. 3, the reception filter 4 and the transmission filter 3 are die-bonded in the package 10 using a die-bonding agent, and are electrically connected to the package 10 by conductive connecting elements 12. For the die-bonding agent, a material having a high thermal conductivity is selected. Thereby, when large electric power is applied to the demultiplexer, temperature increases caused by the heating of the transmission filter 3 and the reception filter 4 can be effectively prevented.

The reception filter 4 and the transmission filter 3 are mounted by die bonding as shown in FIG. 3. However, the present invention is not restricted to die-bonding. The reception filter 4 and the transmission filter 3 may be mounted in the package 10 by flip chip bonding. The package 10 may be a chip size package which is produced by mounting the filters onto a mounting substrate and then sealing it with a resin.

In the package 10, the parallel resonators 4a' of the reception filter 4 and the parallel resonators 3a' of the transmission filter are electrically connected to the lid 10b via a strip line 10d and a through-hole 10c, i.e., via the common line, and thus, are grounded.

As shown in FIG. 3, the package 10 including the transmission filter 3 and the reception filter 4 may be mounted onto a printed circuit board 11 which is composed of a single layer or has a multi-layer structure. In this case, the capacitance elements 2a, 2b, and 2d, and the inductance element 2c may be mounted as chip components onto the printed circuit board 11. The capacitance elements and the inductance element constitute the matching circuit 2 for phase-matching which is provided between the antenna terminal 1 side and the transmission filter 3 and between the antenna terminal 1 side and the reception filter 4.

For the inductance element 2c, an element having a high Q is used. Thereby, the loss can be further reduced, and a high attenuation characteristic can be attained.

In particular, as shown in FIG. 4A, the package 10 including the reception filter 4 and the transmission filter 3, and the capacitance elements 2a, 2b, and 2d, and the inductance element 2c for constituting the matching circuit 2 for phase-matching are mounted on the printed circuit board 11, as shown in FIG. 4B, and are covered with a metallic cover 14. Thus, the demultiplexer having a module structure is formed.

Figure 5C:
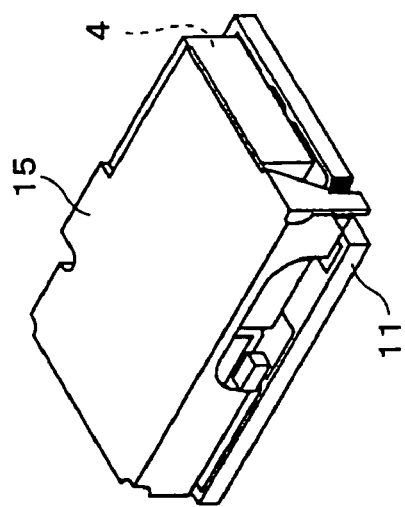
FIGS. 5A to 5C are exploded perspective views showing the assembly process for another example of the demultiplexer having a module structure which is provided with a printed circuit substrate and a metallic cover.
Figure 5B:
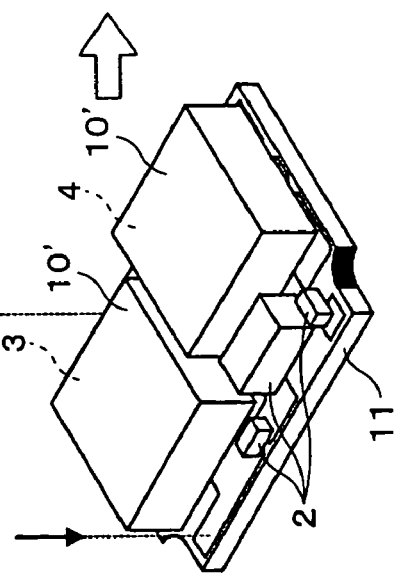
Figure 5A:
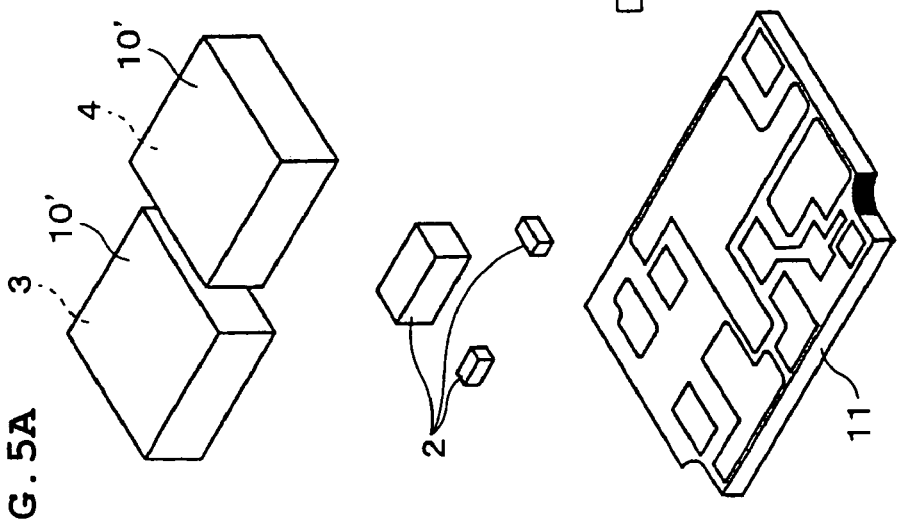

In FIGS. 4(A), 4(B), and 4(C), both of the reception filter 4 and the transmission filter 3 are included in the package 10. However, the present invention is not restricted to this constitution. Packages 10' including the reception filter 4 and the transmission filter 3, respectively, as shown in FIG. 5A, and the capacitance elements 2a, 2b, and 2d and the inductance element 2c constituting the matching circuit 2 for phase matching may be mounted onto the printed circuit board 11 as shown in FIG. 5B. Thereafter, they are covered with a metallic cover 15. Thus, the demultiplexer having a module structure is formed.

Figure 8:
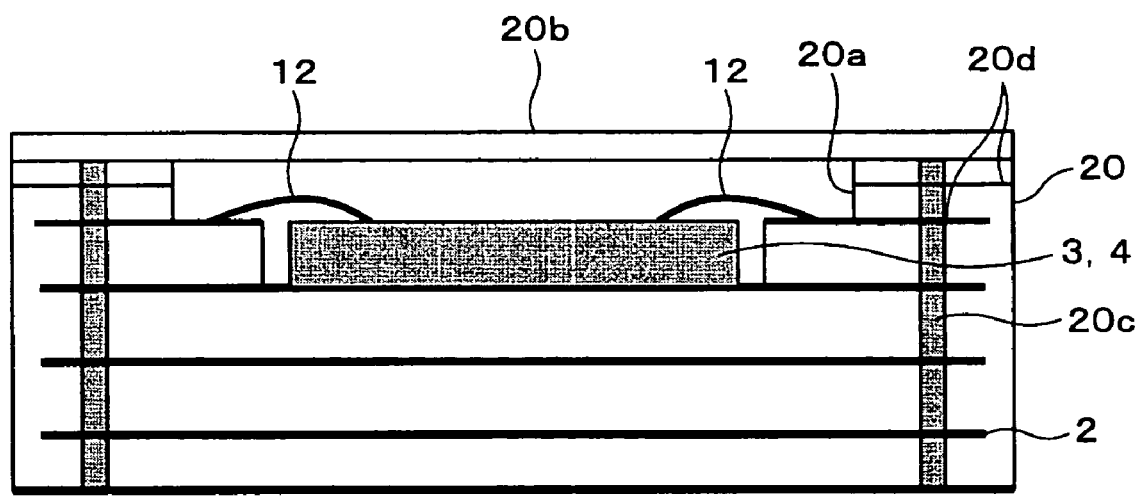
FIG. 8 is a cross-sectional view showing another example of the demultiplexer which is provided with a printed circuit board having a multi-layer structure.

For an example of a method of forming the demultiplexer, the module structure is described above. For example, the filters for transmission and reception and the matching circuit for phase matching may be included in one package 10. In this case, the capacitance elements 2a, 2b, and 2d and the inductance element 2c for constituting the matching circuit 2 are preferably formed using a planar circuit such as strip lines or the like. In particular, as shown in FIG. 8, a ceramic package 20 having a multi-layer structure is preferably used, in which the transmission filter 3 and the reception filter 4 are contained in an internal space 20a and covered with a lid 20b to be sealed. Thus, the matching circuit 2 for phase matching can be formed using via-holes 20c and strip lines 20d, and can be contained in the ceramic package 20. In this case, the number of elements can be reduced. Accordingly, the size of the ceramic package 20 can be decreased.

According to this preferred embodiment, a common inductance component 9 is provided between the ground terminal 4c of the reception filter 4 and the ground terminal 3c of the transmission filter 3, as shown in FIG. 1. The ground terminals 3c and 4c are electrically connected to each other via the common inductance element 9, and are grounded via grounding elements, respectively. Inductance components 3b, which are different from the common inductance component 9, are provided between the common inductance component 9 and the transmission filter 3, in particular, between the common inductance component 9 and the parallel resonators 3a' of the transmission filter 3. Similarly, inductance components 4b, which are different from the common inductance component 9, are provided between the common inductance component 9 and the reception filter 3, in particular, between the common inductance component 9 and the parallel resonators 4a' of the reception filter 3.

In the above-described demultiplexer, an inductance component 7 ranges from the ground terminal 3c of the transmission filter 3 to the connection to the ground out of the package via wirings such as through-holes, strip lines and so forth provided in the package. Similarly, an inductance component 8 ranges from the ground terminal 3c of the transmission filter 3 to the connection to the ground out of the package via wirings such as through-holes, strip lines, and so forth provided in the package.

According to preferred embodiments of the present invention, the common inductance component 9 is provided so that the ground terminals of the transmission filter 3 and the reception filter 4 can be electrically connected to each other via the common inductance component 9. Thus, when the demultiplexer of this preferred embodiment is formed, the required areas for the ground electrodes of the filters can be obtained by effectively utilizing areas and terminals existing in the package 10 and the printed circuit board 11. Thus, the demultiplexer can be reduced in size.

As shown in FIG. 3, in the package 10, the parallel resonators 4a' of the reception filter 4 and the parallel resonators 3a' of the transmission filter 3 are electrically connected to the lid 10b via the strip line 10d and the through hole 10c. Thus, these parallel resonators 3a' and 4a' are electrically connected to each other via the common elements, and are grounded. Therefore, the common inductance component 9 includes the strip line 10d of the package 10 and the lid 10b of the package 10. The present invention is not restricted to this inductance component. In the case in which the package 10 is mounted on the printed circuit board 11, the common inductance component 9 may include conductor elements of the demultiplexer such as a strip line 11a in the printed circuit board 11 and the metallic covers 14 shown in FIGS. 4(A), 4(B), 4(C), 5(A), 5(B), 5(C), and so forth.

Moreover, the inductance components 3b between the common inductance component 9 and the parallel resonators 3a' of the transmission filter 3, and the inductance components 4b between the common inductance component 9 and the parallel resonators 4a' of the reception filter 4 are preferably made of wires 12 as shown in FIG. 3.

Referring to the demultiplexer having a module structure, a method of electrically connecting the ground terminal 4c of the reception filter 4 and the ground terminal 3c of the transmission filter 3 to each other via a common element, i.e., the printed circuit board 11, is described in detail with reference to FIGS. 6A to 6D.

FIG. 6A is a plan view of the back surface of the package 10. FIG. 6B is a plan view of the uppermost layer 11b of the printed circuit board 11 to which the package 10 is to be mounted. FIG. 6C is a plan view of an inner layer 11c of the printed circuit board 11. FIG. 6D is a plan view of the back surface of the lowermost layer 11d of the printed circuit board 11.

As shown in FIG. 6A, a ground terminal 10t of the package on the reception side connected to the ground terminal 4c of the reception filter 4, and a ground terminal 10s of the package on the transmission side connected to the ground terminal 3c of the transmission filter 3 are disposed on the back surface of the package 10. It should be noted that FIG. 6B and FIG. 6D are perspective views taken from the upper side, respectively.

FIG. 6B shows the surface of the uppermost layer 11b of the printed circuit board 11 on which the package 10 is to be mounted. The three squares completely shaded black in FIG. 6B represent the sites on which the ground electrodes 10t of the package on the reception side and the ground electrode 10s of the package on the transmission side are disposed. The ground terminals 10t of the package on the reception side are electrically connected to a ground pattern 11f on the printed circuit board 11. The ground terminal 10s is electrically connected to a ground pattern 11g on the printed circuit board 11 by solder or other suitable material or elements.

As shown in FIG. 6C, the ground pattern 11f of the uppermost layer 11b is electrically connected to a ground pattern 11i of the inner layer 11c via a through hole 11e. Moreover, the ground pattern 11g of the uppermost layer 11b is electrically connected to the ground pattern 11i of the inner layer 11c via a through hole 11h. That is, the ground pattern 11g and the ground pattern 11f of the uppermost layer 11b are electrically connected to the ground pattern 11i of the inner layer 11c. Thus, the ground terminal 4c of the reception filter 4 and the ground terminal 3c of the transmission filter 3 are connected to each other via the printed circuit board 11 in common.

Figure 7A:
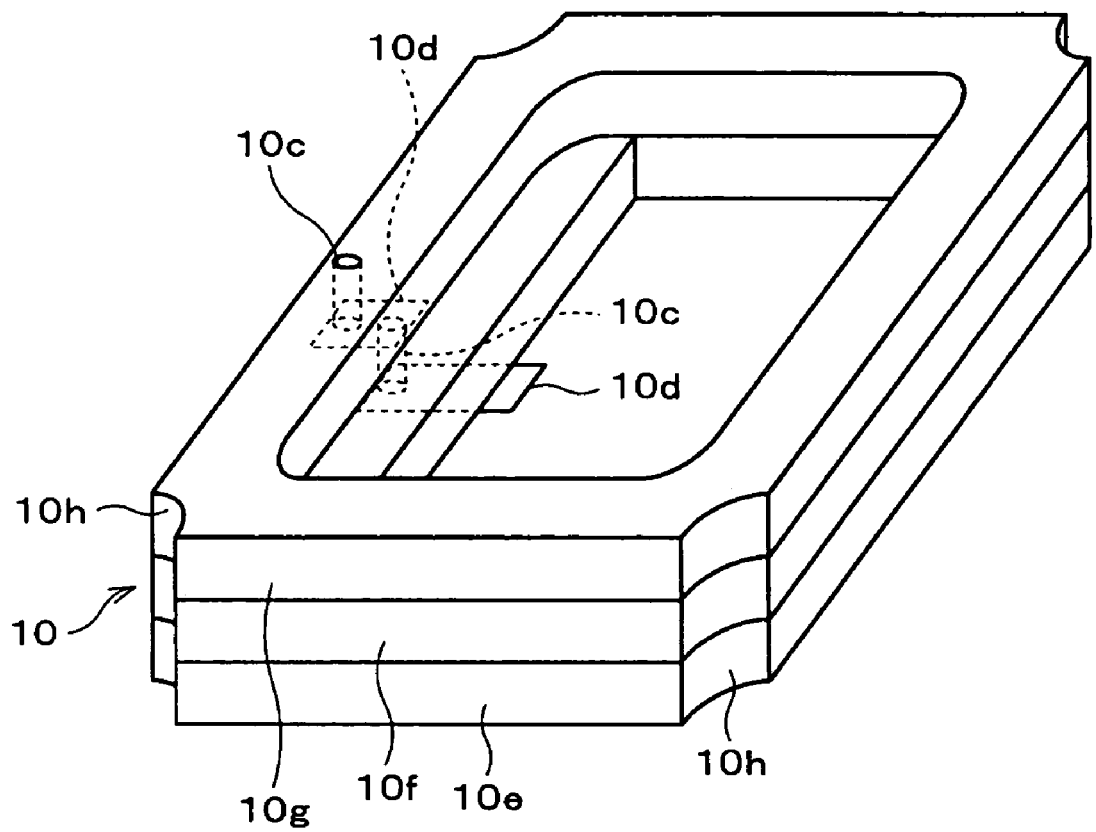
FIG. 7A is a perspective view of the package.
Figure 7B:
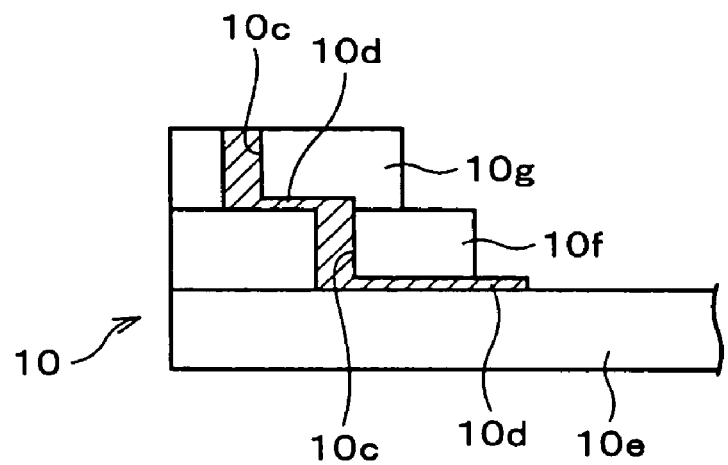
FIG. 7B is a cross-sectional view of the essential portion of the package.

As shown in FIG. 3, according to this preferred embodiment, the through hole 10c is formed so as to pass through in a straight line. The present invention is not restricted to this shape and arrangement of the through hole. As shown in FIGS. 7A and 7B, in the case of the package 10 having a multi-layer structure including layers 10e to 10g, through holes 10 may be formed in the layers 10e to 10g in positions which are changed every layer, and are connected to each other via strip lines 10d. In FIGS. 7A and 7B, castrations 10h are provided. However, they are not necessary.

In the case of the common inductance component 9 having a low inductance, the component 9 exerts less influence over the in-band loss, especially over the steepness and attenuation amount in the vicinity of the low frequency range side in the pass band of the reception filter 4, and also over the steepness and attenuation amount in the vicinity of the low frequency range side of the isolation characteristic.

Hereinafter, advantages of this preferred embodiment are described with reference to Table 1, FIG. 9, FIG. 10, FIG. 11, and FIG. 12. The inductance of the common inductance component 9 shown in FIG. 1 and FIG. 2 was sequentially changed, and the steepness and out-of-pass-band attenuation amount of the frequency characteristics of the reception filter, and the steepness between the transmission band and the reception band, and the change of the attenuation amount of the frequency characteristics (isolation) in the range from the transmission filter 3 to the reception filter 4. Thus, the following results were obtained.

Figure 11:
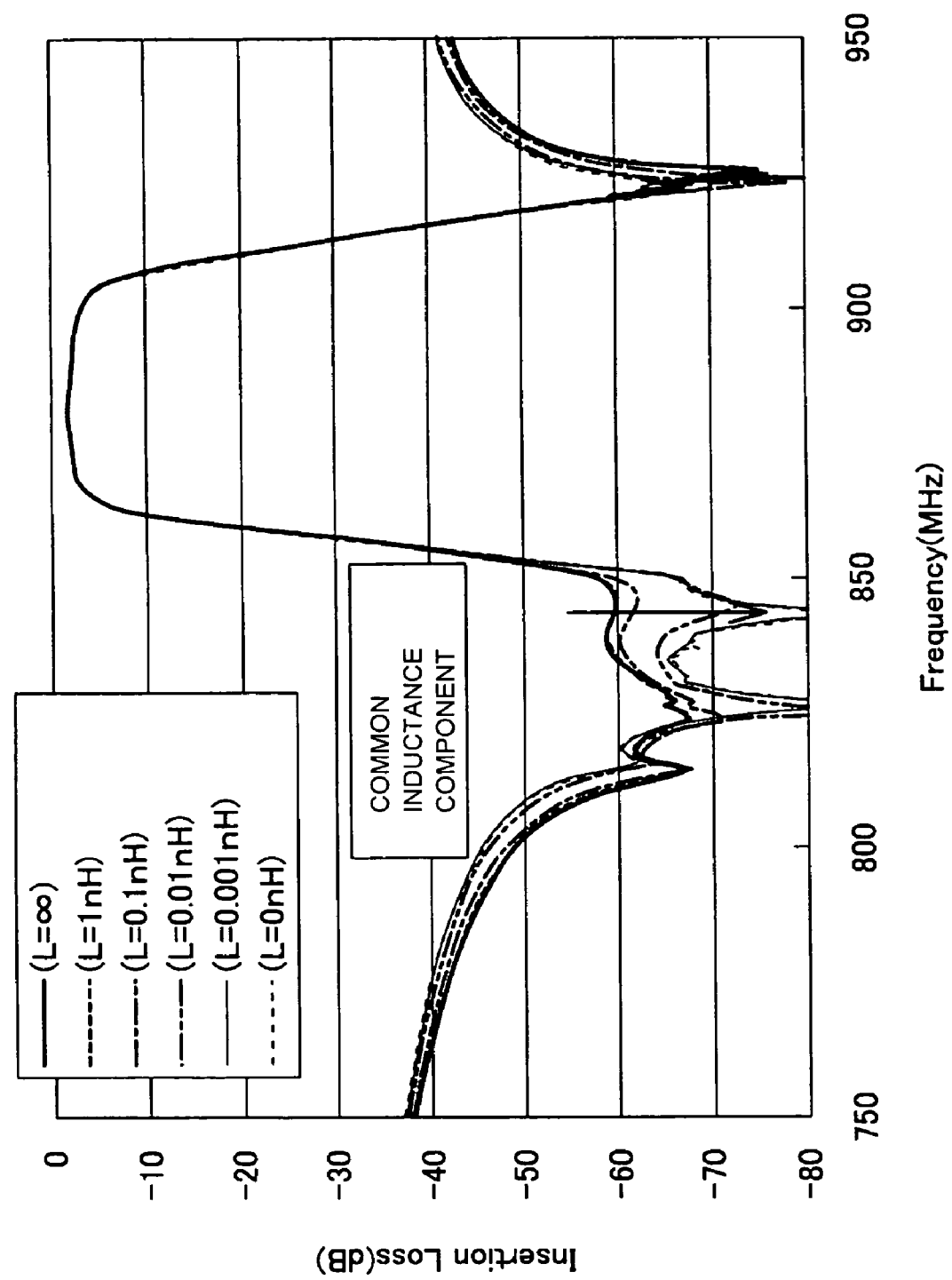
FIG. 11 is a graph showing the change of the insertion loss of the frequency characteristics determined in the range extending from the reception side to the antenna terminal, with the inductance of the common inductance component being changed in the demultiplexer.
Figure 12:
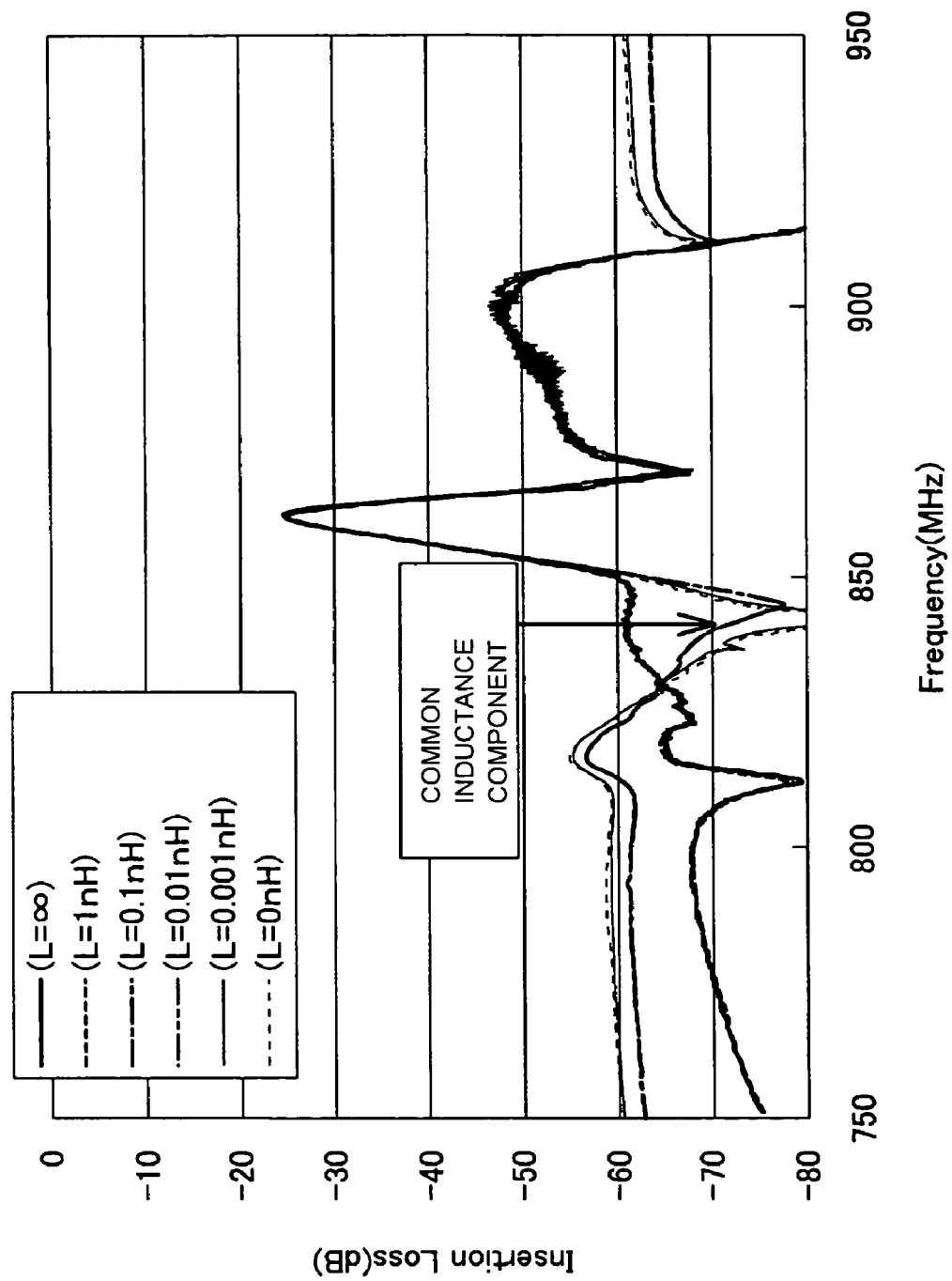
FIG. 12 is a graph showing the change of the insertion loss of the frequency characteristics determined in the range extending from the transmission side to the reception side and with respect to the change of the common inductance component in the demultiplexer.

FIG. 11 shows the change of insertion loss of the frequency characteristics in the range from the reception filter side to the antenna side, caused when the common inductance component 9 was sequentially changed. FIG. 12 shows the change of insertion loss of the frequency characteristics (isolation) in the range from the transmission filter 3 to the reception filter 4, caused when the common inductance component 9 was sequentially changed.

Figure 9:
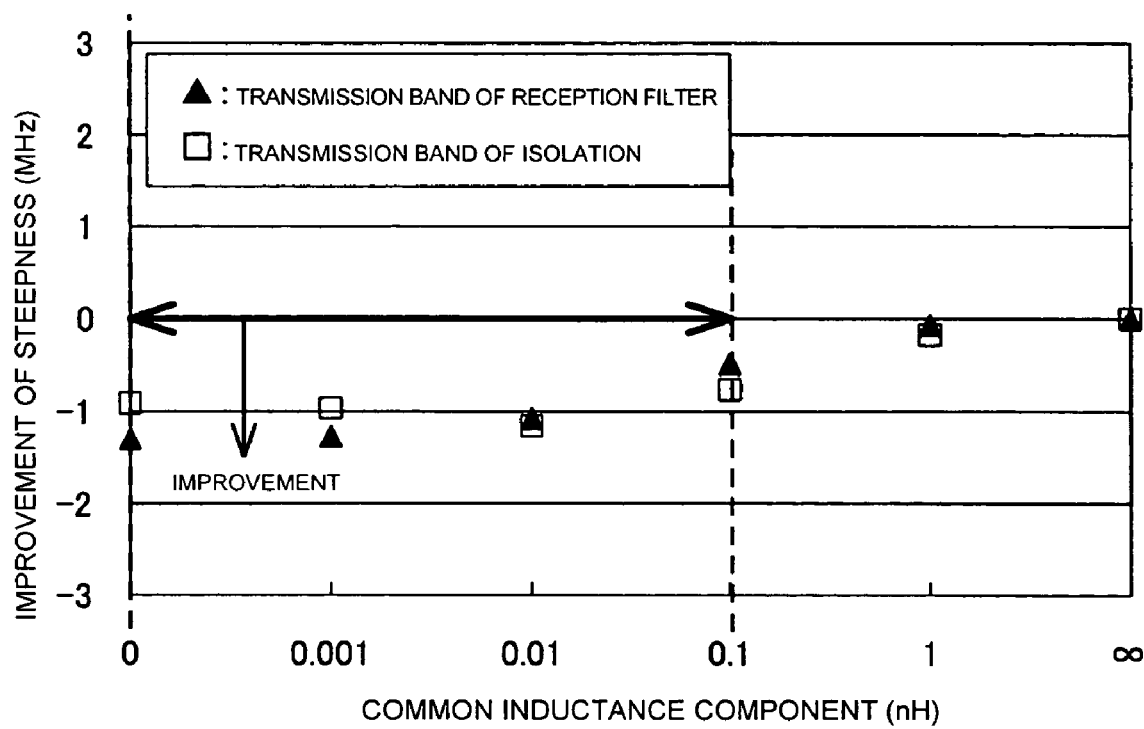
FIG. 9 is a graph showing the change of the steepness with the inductance of a common inductance component being changed in the demultiplexer.
Figure 10:
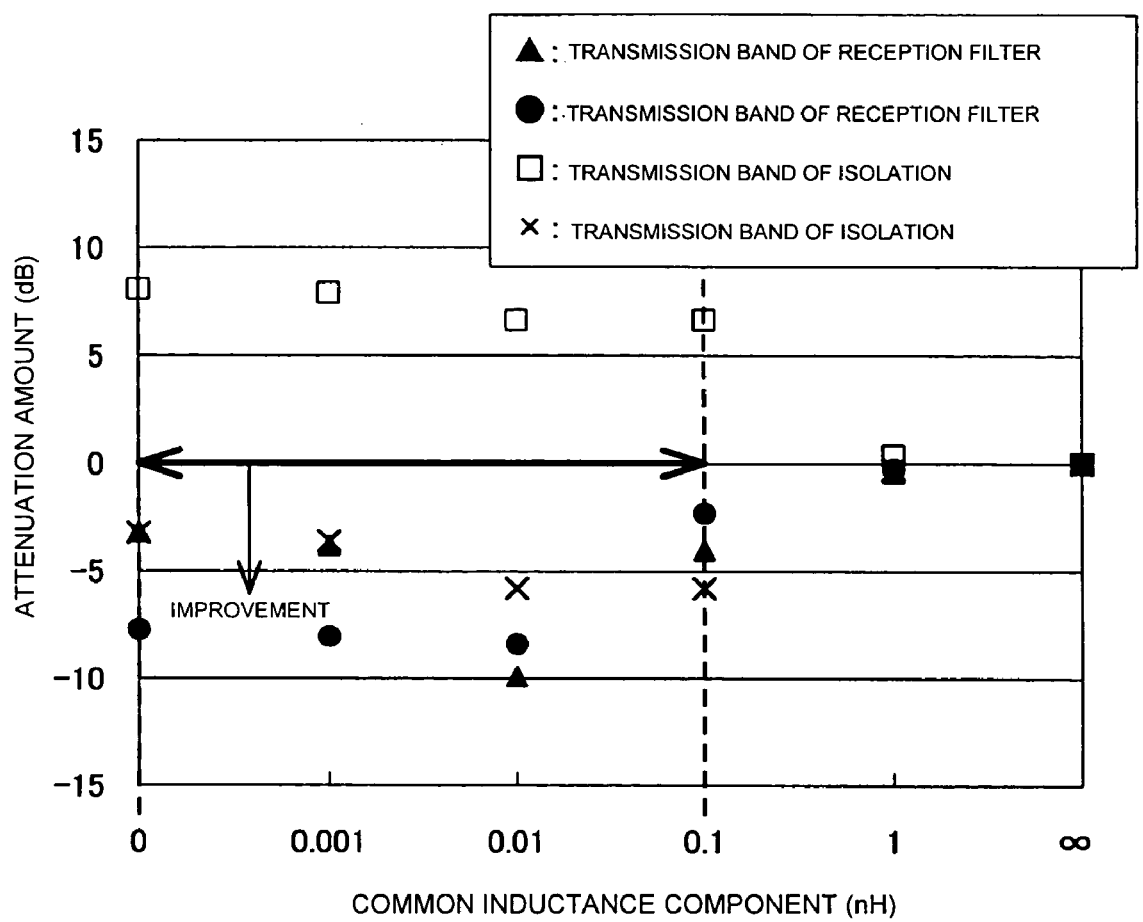
FIG. 10 is a graph showing the change of the attenuation amount with the inductance of the common inductance component being changed in the demultiplexer.

Table 1 shows the frequency intervals (steepness) at which the insertion loss between the transmission band of the transmission filter 3 and the reception band of the reception filter 4 is in the range of about −3.5 dB to about −53 dB, and also, the insertion amounts at 849 MHz. The frequency intervals and the insertion amounts are expressed as the differences from the values of zero of the known configuration in which the common inductance is infinite, that is, the ground terminal of the reception filter and the ground terminal of the transmission filter are grounded separately from each other without being electrically connected to each other via a common element, as shown in FIGS. 11 and 12. Moreover, FIGS. 9 and 10 are graphs showing the relationships between the inductance of the common inductance component 9, the steepness and the attenuation amount shown in Table 1. Regarding the values shown in Table 1, the smaller the values are, the more improved the steepness and the attenuation amount are.

That is, the ground terminal 3c of the transmission filter 3 and the ground terminal 4c of the reception filter 4 are connected to each other via the common inductance component 9 having a very small inductance. Thereby, the inductance components 7 and 8 in the range from the ground terminals 3c and 4c to the ground which is on the outer side of the package can be connected in parallel to each other. As a result, the inductance component in the range from the ground terminal 3c of the transmission filter 3 to the ground and also from the ground terminal 4c of the reception filter 4 to the ground which is on the outside of the package becomes substantially small. It is estimated that this state is comparable to the state which is caused by enhancement of the grounding, and thus, the isolation characteristic can be improved.

TABLE 1

| COMMON IN-DUCTANCE COMPONENT (NH) | TRANSMISSION BAND IMPROVEMENT OF RECEPTION FILTER | | TRANSMISSION BAND IMPROVEMENT OF ISOLATION | |
|---|---|---|---|---|
| | STEEP-NESS (MHZ) | ATTENUATION (@849 MHZ) (DB) | STEEP-NESS (MHZ) | ATTENUATION (@849 MHZ) (DB) |
| 0 | −1.30 | −7.73 | −0.91 | −3.20 |
| 0.001 | −1.27 | −8.04 | −0.96 | −3.59 |
| 0.01 | −1.07 | −8.41 | −1.15 | −5.81 |
| 0.1 | −0.49 | −2.31 | −0.77 | −5.81 |
| 1 | −0.07 | −0.27 | −0.18 | −0.30 |
| ∞ | 0.00 | 0.00 | 0 | 0.00 |

As seen in Table 1, and FIGS. 9 to 12, in the range where the inductance of the common inductance component 9 is not more than about 1 nH, the steepness of the reception filter 4 and the isolation, and the transmission-band attenuation amounts of the reception filter 4 and the isolation are improved compared to the case in which no common inductance component 9 is provided (the common inductance is infinite).

In particular, the common inductance component 9 having an inductance of not more than about 0.1 nH improves the steepness of the reception filter 4 and the isolation and also, the transmission-band attenuation amounts of the reception filter 4 and the isolation by a maximum of about 5 dB to about 10 dB.

Table 1 and FIGS. 9 to 12 use the circuit configuration shown in FIGS. 1 and 2. Thus, the inductance components 3b, which are different from the common inductance component 9, are provided between the common inductance component 9 and the transmission filter 3, specifically between the common inductance component 9 and the parallel resonators 3a' of the transmission filter 3. Similarly, the inductance components 4b, which are different from the common inductance component 9, are provided between the common inductance component 9 and the reception filter 4, specifically between the common inductance component 9 and the parallel resonators 4a' of the reception filter 4.

If the inductance components 3b and 4b are not provided, the ground terminals 3c and 4c of the transmission filter 3 and the reception filter 4 have the same potentials, and thus, the isolation is deteriorated.

On the other hand, according to preferred embodiments of the present invention, the inductance components 3b and 4b are provided. Thus, the potentials of the ground terminals 3c and 4c of the transmission filter 3 and the reception filter 4 can be prevented from being equal to each other. Accordingly, deterioration of the isolation can be prevented.

As parasitic components, mainly, plural inductance components (e.g., the inductance components 7 and 8) occur between the transmission and reception filters and the ground potential, due to wires, strip lines formed in the package, side surface electrodes, through holes, jigs, and so forth. If these components are completely shortcircuited, the ground potentials of the transmission filter 3 and the reception filter 4 approach the same value. Thus, the transmission band attenuation amount of the reception filter 4 and the transmission band attenuation amount of the isolation are slightly deteriorated.

According to the present preferred embodiment, ladder type SAW filters are preferably used as the reception filter and the transmission filter. The present invention is not restricted to this filter. According to another preferred embodiment, piezoelectric filters including piezoelectric thin-film SAW resonators 60 shown in FIG. 14, which are arranged in a ladder configuration, may be used as the reception filter and the transmission filter. In detail, the piezoelectric thin-film resonator 60 includes an Si substrate 61 having an opening 67, an insulation film 62 arranged so as to cover the opening 67, a lower electrode 63 made of Al and disposed on the insulation film 62, a piezoelectric thin film 64 made of ZnO or AlN, and an upper electrode 65 made of Al. The insulation film 62 has a multi-layer structure including an insulation film 62a made of $SiO_2$ and an insulation film 62b made of $Al_2O_3$ and AlN. In the case in which the insulation film 62a of $SiO_2$ is formed by heat-oxidation of the Si substrate 61, an insulation film 66 made of $SiO_2$ is also formed on the back surface of the Si substrate 61.

Hereinafter, the advantages of this preferred embodiment will be described. First, in the demultiplexer in which high attenuation amounts are required on the side (reception band) opposite to the transmission filter 3, and also, on the side (transmission band) opposite to the reception filter 4, the potential terminals 4c and 3c of the reception filter 4 and the transmission filter 3 are electrically connected to each other via the common inductance component 9 which includes, e.g., the printed circuit board 11, strip lines in the package 10, the metallic covers 14 and 15, and so forth according to this preferred embodiment.

Moreover, the inductance components 3b which are different from the common inductance component 9 are provided between the common inductance component 9 and the transmission filter 3, specifically between the common inductance component 9 and the parallel resonators 3a' of the transmission filter 3. The inductance components 4b which are different from the common inductance component 9 are provided between the common inductance component 9 and the reception filter 4, specifically between the common inductance component 9 and the parallel resonators 4a' of the reception filter 4.

When the inductance of the common inductance component 9, which includes the printed circuit board 11, strip lines in the package 10, the metallic covers 14 and 15, and so forth, is small, the common inductance component 9 exerts less influence over the in-band loss, and especially, the steepness and attenuation amount in the vicinity of the lower frequency range side of the reception filter 4, and the steepness and attenuation amount in the vicinity of the lower frequency range side of the isolation characteristic can be improved.

Specifically, as seen in Table 1 and FIGS. 9 to 12, in the range where the inductance of the common inductance component 9 is not more than about 1 nH, and preferably, less than about 1 nH, the steepness of the reception filter 4 and the isolation, and the transmission band attenuation amounts of the reception filter 4 and the isolation (lower frequency range side) are improved compared to the case in which no common inductance component 9 is provide (open).

Especially, in the case in which the common inductance component 9 is set at not more than about 0.1 nH, the attenuation amount in the vicinity of the lower frequency range side of the reception filter 4 and the attenuation amount of the isolation characteristic can be improved by a maximum of about 5 dB to about 10 dB.

Moreover, the potentials of the ground terminals 3c and 4c of the transmission filter 3 and the reception filter 4 are prevented from being equal to each other, since the inductance components 3b and 4b are provided. Accordingly, deterioration of the isolation can be prevented.

The demultiplexer of various preferred embodiments of the present invention can be reduced in size while the isolation characteristics between the reception filter and the transmission filter are maintained. The demultiplexer is suitable for use in small-sized communication devices such as portable telephones or the like.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:
1. A demultiplexer comprising:
an antenna terminal;
a reception filter connected to the antenna terminal;
a transmission filter connected in parallel to the reception filter with respect to the antenna terminal and having a pass band center frequency that is different from the reception filter;

a common inductance component connected between the ground terminal of the transmission filter and the ground terminal of the reception filter; and inductance components, which are different from the common inductance component, provided between the common inductance component and the reception filter and between the common inductance component and the transmission filter.

2. A demultiplexer according to claim 1, wherein at least one of the reception filter and the transmission filter is a surface acoustic wave filter.

3. A demultiplexer according to claim 1, wherein at least one of the reception filter and the transmission filter is a piezoelectric filter.

4. A demultiplexer according to claim 1, wherein at least one of a metallic cover, a strip line disposed in a printed circuit board, and a strip line disposed in a package defines the common inductance component.

5. A demultiplexer according to claim 1, wherein the common inductance component has an inductance of not more than about 0.1 nH.

6. A demultiplexer according to claim 1, wherein the demultiplexer has a frequency arrangement of Advanced MobilePhone Service.

7. A demultiplexer according to claim 1, wherein the transmission filter is a ladder-type SAW filter including three series arm resonators and two parallel arm resonators.

8. A demultiplexer according to claim 1, wherein the reception filter is a ladder-type SAW filter including two series arm resonators and three parallel arm resonators.

9. A demultiplexer according to claim 1, further comprising a chip package, wherein the transmission filter and the reception filter are provided in the chip package.

10. A demultiplexer according to claim 9, further comprising a printed circuit board upon which the chip package including the transmission filter and the reception filter are mounted, and a cover mounted on the printed circuit board so as to cover the chip package.

11. A demultiplexer according to claim 10, further comprising a matching circuit including capacitance elements and an inductance element mounted on the printed circuit board.

12. A demultiplexer according to claim 1, further comprising a matching circuit including capacitance elements and an inductance element on the antenna terminal side.

13. A demultiplexer according to claim 1, further comprising a matching circuit including via-holes and strip lines.

14. A demultiplexer according to claim 1, wherein the inductance components are provided between the common inductance component and parallel resonators of the transmission filter.

15. A demultiplexer according to claim 1, wherein the inductance components are provided between the common inductance component and parallel resonators of the reception filter.

16. A demultiplexer according to claim 1, wherein the ground terminals of the transmission filter and the reception filter are electrically connected to each other via the common inductance component.

17. A demultiplexer according to claim 1, wherein the reception filter and the transmission filter include parallel resonators and the parallel resonators of the reception filter and the transmission filter are electrically connected to each other.

18. A demultiplexer according to claim 1, wherein the inductance components include wires.

19. A demultiplexer according to claim 1, wherein the potentials of the ground terminals the transmission filter and the reception filter are not equal to each other.

20. A communication device including the demultiplexer according to claim 1.

* * * * *